(12) United States Patent
Lee (10) Patent No.: US 10,305,481 B2
(45) Date of Patent: May 28, 2019

(54) PRE-DRIVER FOR DRIVING LOW VOLTAGE DIFFERENTIAL SIGNALING (LVDS) DRIVING CIRCUIT

(71) Applicant: VIA Alliance Semiconductor Co., Ltd., Shanghai (CN)

(72) Inventor: Yeong-Sheng Lee, Fremont, CA (US)

(73) Assignee: VIA ALLIANCE SEMICONDUCTOR CO., LTD., Shanghai (CN)

( * ) Notice: Subject to any disclaimer, the term of this patent is extended or adjusted under 35 U.S.C. 154(b) by 0 days.

(21) Appl. No.: 15/066,205

(22) Filed: Mar. 10, 2016

(65) Prior Publication Data

US 2017/0264296 A1 Sep. 14, 2017

(51) Int. Cl.
*H03K 3/00* (2006.01)
*H03K 19/0185* (2006.01)
*H03K 19/00* (2006.01)
*H03K 19/003* (2006.01)
*H03K 19/017* (2006.01)

(52) U.S. Cl.
CPC . *H03K 19/018507* (2013.01); *H03K 19/0013* (2013.01); *H03K 19/00315* (2013.01); *H03K 19/017* (2013.01)

(58) Field of Classification Search
None
See application file for complete search history.

(56) References Cited

U.S. PATENT DOCUMENTS

| 5,180,990 A * | 1/1993 | Ohkuma | H03G 5/025 330/304 |
| 9,148,130 B1 * | 9/2015 | Naviasky | H03K 3/015 |
| 2009/0153219 A1 * | 6/2009 | Wu | H03F 1/0205 327/333 |

OTHER PUBLICATIONS

Hodges et al., Analysis and Design of Digital Integrated Circuits, 1988, 2nd Edition, pp. 408-411.*

* cited by examiner

*Primary Examiner* — Long Nguyen
(74) *Attorney, Agent, or Firm* — McClure, Qualey & Rodack, LLP (57) ABSTRACT

A pre-driver for driving an LVDS (Low Voltage Differential Signaling) driving circuit is provided. The pre-driver includes a first inverter, a high-pass filter, and a second inverter. The first inverter has an input terminal coupled to an input node of the pre-driver, and an output terminal coupled to a first node. The high-pass filter is coupled between the first node and a second node. The second inverter has an input terminal coupled to the second node, and an output terminal coupled to an output node of the pre-driver. The high-pass filter is configured to improve a high-frequency response of the pre-driver.

1 Claim, 7 Drawing Sheets

PRE-DRIVER FOR DRIVING LOW VOLTAGE DIFFERENTIAL SIGNALING (LVDS) DRIVING CIRCUIT

BACKGROUND OF THE INVENTION

Field of the Invention

The disclosure generally relates to a pre-driver, and more particularly, to a pre-driver for driving an LVDS (Low Voltage Differential Signaling) driving circuit.

Description of the Related Art

Differential signaling circuits are very popular, being used in data transmission nowadays, including LVDS (Low Voltage Differential Signaling), HDMI (High-Definition Multimedia Interface), USB (Universal Serial Bus), etc. Differential signaling circuits have advantages that include saving power and reducing noise.

However, differential signaling circuits still have some disadvantages. LVDS driving circuits, for example, may have large parasitic capacitances at their input terminals, which slow down logic level transitions at their output terminals, so the LVDS driving circuits may tend to be affected by power supply noise. Accordingly, there is a need to propose a solution for solving the problem of conventional LVDS driving circuits.

BRIEF SUMMARY OF THE INVENTION

In a preferred embodiment, the disclosure is directed to a pre-driver for driving an LVDS (Low Voltage Differential Signaling) driving circuit according to a data signal, including: a first inverter, wherein the first inverter has an input terminal coupled to an input node of the pre-driver, and an output terminal coupled to a first node, wherein the input node of the pre-driver is coupled to the data signal; a high-pass filter, coupled between the first node and a second node and configured to improve a high-frequency response of the pre-driver; and a second inverter, wherein the second inverter has an input terminal coupled to the second node, and an output terminal coupled to an output node of the pre-driver, wherein the output node of the pre-driver is coupled to the LVDS driving circuit.

In some embodiments, a size of the second inverter is greater than a size of the first inverter.

In some embodiments, the high-pass filter includes: a capacitor, coupled between the first node and the second node.

In some embodiments, the high-pass filter includes: a first inductor; and a first resistor, wherein the first inductor and the first resistor are coupled in series between a supply voltage and the second node.

In some embodiments, the high-pass filter includes: a second inductor; and a second resistor, wherein the second inductor and the second resistor are coupled in series between the second node and a ground voltage.

In some embodiments, the LVDS driving circuit includes: a first transistor, wherein the first transistor has a control terminal, a first terminal coupled to a supply voltage, and a second terminal coupled to a positive output node; a second transistor, wherein the second transistor has a control terminal, a first terminal coupled to the supply voltage, and a second terminal coupled to a negative output node; a third transistor, wherein the third transistor has a control terminal, a first terminal coupled to a ground voltage, and a second terminal coupled to the positive output node; and a fourth transistor, wherein the fourth transistor has a control terminal, a first terminal coupled to the ground voltage, and a second terminal coupled to the negative output node.

In some embodiments, the output node of the pre-driver is coupled to at least one of the control terminals of the first transistor, the second transistor, the third transistor, and the fourth transistor.

In another preferred embodiment, the disclosure is directed to a pre-driver for driving an LVDS (Low Voltage Differential Signaling) driving circuit according to a data signal, including: a first inverter, wherein the first inverter has an input terminal coupled to an input node of the pre-driver, and an output terminal coupled to a first node, wherein the input node of the pre-driver is coupled to the data signal; and a second inverter, including a high-pass filter configured to improve a high-frequency response of the pre-driver, wherein the second inverter has an input terminal coupled to the first node, and an output terminal coupled to an output node of the pre-driver, wherein the output node of the pre-driver is coupled to the LVDS driving circuit.

In some embodiments, a size of the second inverter is greater than a size of the first inverter.

In some embodiments, the second inverter includes: a pulling-down transistor, wherein the pulling-down transistor has a control terminal coupled to a second node, a first terminal coupled to a ground voltage, and a second terminal coupled to the output node of the pre-driver; and a pulling-up transistor, wherein the pulling-up transistor has a control terminal coupled to a third node, a first terminal coupled to a supply voltage, and a second terminal coupled to the output node of the pre-driver.

In some embodiments, the high-pass filter includes: a first capacitor, coupled between the first node and the second node; and a second capacitor, coupled between the first node and the third node.

In some embodiments, the high-pass filter includes: a first inductor; and a first resistor, wherein the first inductor and the first resistor are coupled in series between the supply voltage and the second node.

In some embodiments, the high-pass filter includes: a second inductor; and a second resistor, wherein the second inductor and the second resistor are coupled in series between the third node and the ground voltage.

In some embodiments, the LVDS driving circuit includes: a first transistor, wherein the first transistor has a control terminal, a first terminal coupled to a supply voltage, and a second terminal coupled to a positive output node; a second transistor, wherein the second transistor has a control terminal, a first terminal coupled to the supply voltage, and a second terminal coupled to a negative output node; a third transistor, wherein the third transistor has a control terminal, a first terminal coupled to a ground voltage, and a second terminal coupled to the positive output node; and a fourth transistor, wherein the fourth transistor has a control terminal, a first terminal coupled to the ground voltage, and a second terminal coupled to the negative output node.

In some embodiments, the output node of the pre-driver is coupled to at least one of the control terminals of the first transistor, the second transistor, the third transistor, and the fourth transistor.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention are described in detail as follows.

Figure 1:
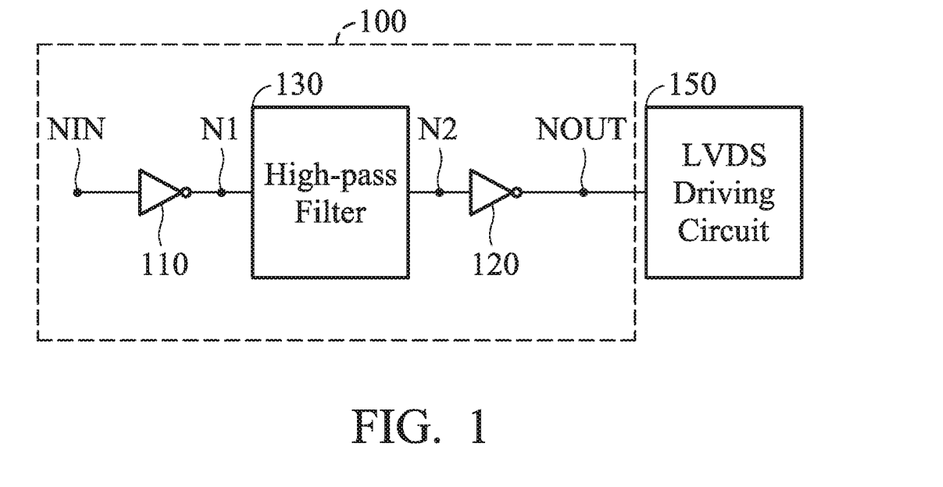
FIG. 1 is a diagram of a pre-driver for driving an LVDS (Low Voltage Differential Signaling) driving circuit according to an embodiment of the invention.

FIG. 1 is a diagram of a pre-driver 100 for driving an LVDS (Low Voltage Differential Signaling) driving circuit 150 according to an embodiment of the invention. The pre-driver 100 is coupled to receive one of one or more data signals (e.g. one of a data signal and a corresponding inverted data signal) and to drive the LVDS driving circuit 150 according to one of the one or more data signals. The pre-driver 100 and the LVDS driving circuit 150 may be applied to a mobile device, such as a smartphone, a tablet computer, or a notebook computer. In the embodiment of FIG. 1, the pre-driver 100 with an input node NIN and an output node NOUT includes a first inverter 110, a second inverter 120, and a high-pass filter 130. The input node NIN of the pre-driver 100 is coupled to one of the one or more data signals. In one embodiment, the first inverter 110 and the second inverter 120 may be CMOS (Complementary Metal Oxide Semiconductor) inverters. The size of the second inverter 120 (i.e., the aspect ratios (W/L) of the CMOS transistors of the second inverter 120) is greater than the size of the first inverter 110 (i.e., the aspect ratios (W/L) of the CMOS transistors of the first inverter 110), such that the second inverter 120 has a stronger capability for driving currents than the first inverter 110 does. The first inverter 110 has an input terminal coupled to the input node NIN of the pre-driver 100, and an output terminal coupled to a first node N1. The second inverter 120 has an input terminal coupled to a second node N2, and an output terminal coupled to the output node NOUT of the pre-driver 100. The high-pass filter 130 is coupled between the first node N1 and the second node N2. The high-pass filter 130 is configured to improve a high-frequency response of the pre-driver 100.

The detailed structure of the pre-driver 100 and the LVDS driving circuit 150 will be discussed in the following embodiments. It should be understood that these embodiments are just exemplary, and shall not restrict limitations of the invention.

Figure 2:
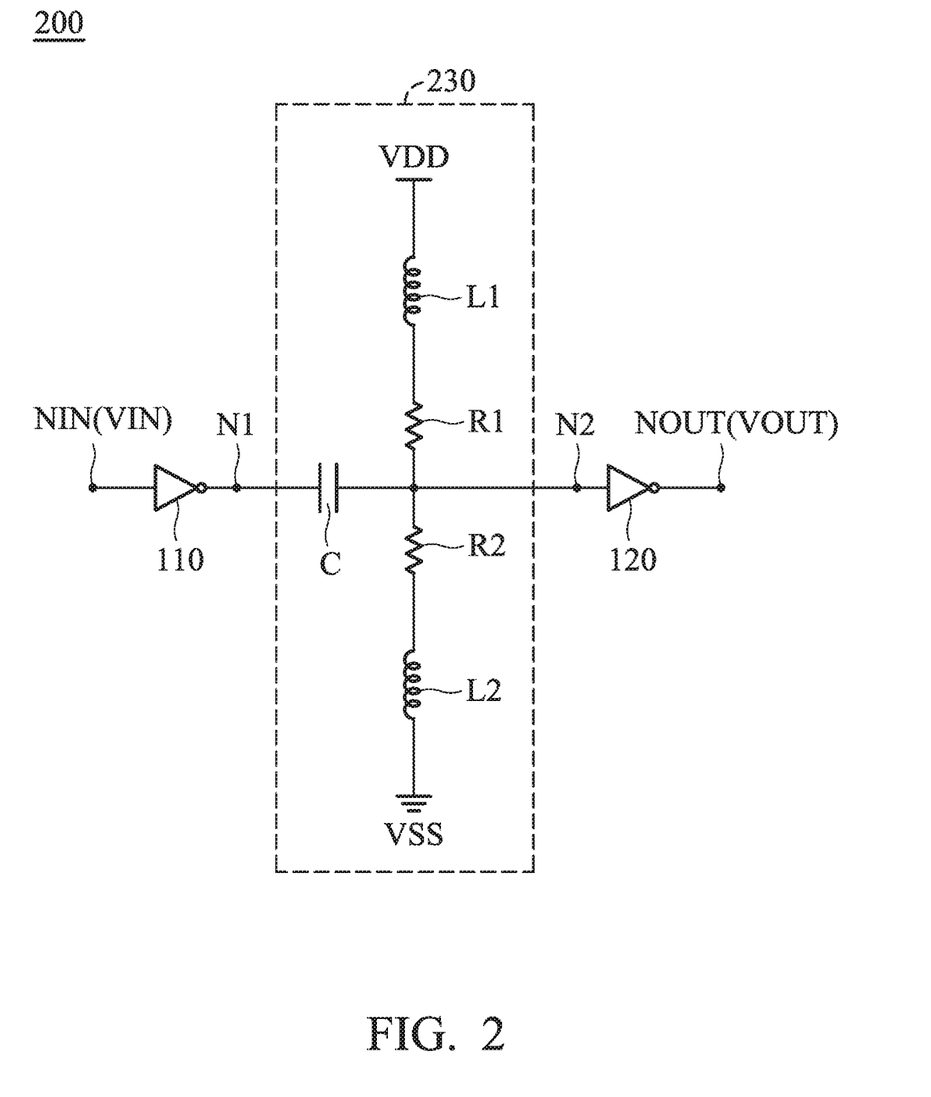
FIG. 2 is a diagram of a pre-driver according to an embodiment of the invention.

FIG. 2 is a diagram of a pre-driver 200 according to an embodiment of the invention. In the embodiment of FIG. 2, the pre-driver 200 includes a first inverter 110, a second inverter 120, and a high-pass filter 230. The first inverter 110 has an input terminal coupled to an input node NIN of the pre-driver 200, and an output terminal coupled to a first node N1. The second inverter 120 has an input terminal coupled to a second node N2, and an output terminal coupled to an output node NOUT of the pre-driver 200. The high-pass filter 230 is coupled between the first node N1 and the second node N2. The high-pass filter 230 includes a capacitor C, a first inductor L1, a second inductor L2, a first resistor R1, and a second resistor R2. The capacitor C is coupled between the first node N1 and the second node N2. The first inductor L1 and the first resistor R1 are coupled in series between a supply voltage VDD and the second node N2. The second inductor L2 and the second resistor R2 are coupled in series between the second node N2 and a ground voltage VSS. The locations of the first inductor L1 and the first resistor R1 (and also the locations of second inductor L2 and the second resistor R2) may be exchanged without affecting the overall performance, as may be understood by those skilled in the art.

In some embodiments, the parameters of the pre-driver 200 are set as follows. The capacitance of the capacitor C is about 0.3 pF. The inductance of the first inductor L1 is about 1 nH. The inductance of the second inductor L2 is about 1 nH. The resistance of the first resistor R1 is about 100Ω. The resistance of the second resistor R2 is about 100Ω. The resonant frequency of the high-pass filter 230 is about 13 GHz, corresponding to the high-frequency operation bands of the LVDS driving circuit above 10 GHz. In other embodiments of the pre-driver 200, the high-pass filter 230 may be placed before the first inverter 110 (i.e., coupled between the input node NIN of the pre-driver 200 and the input terminal of the first inverter 110) or after the second inverter 120 (i.e., coupled between the output terminal of the second inverter 120 and the output node NOUT of the pre-driver 200); however, the configuration of coupling the high-pass filter 130 between the first node N1 and the second node N2 is expected to more beneficial for designing the resonant frequency of the capacitor C, the first inductor L1, and the second inductor L2, since the loading before the first inverter 110 may be too small and the loading after the second inverter 120 may be too large.

Figure 3:
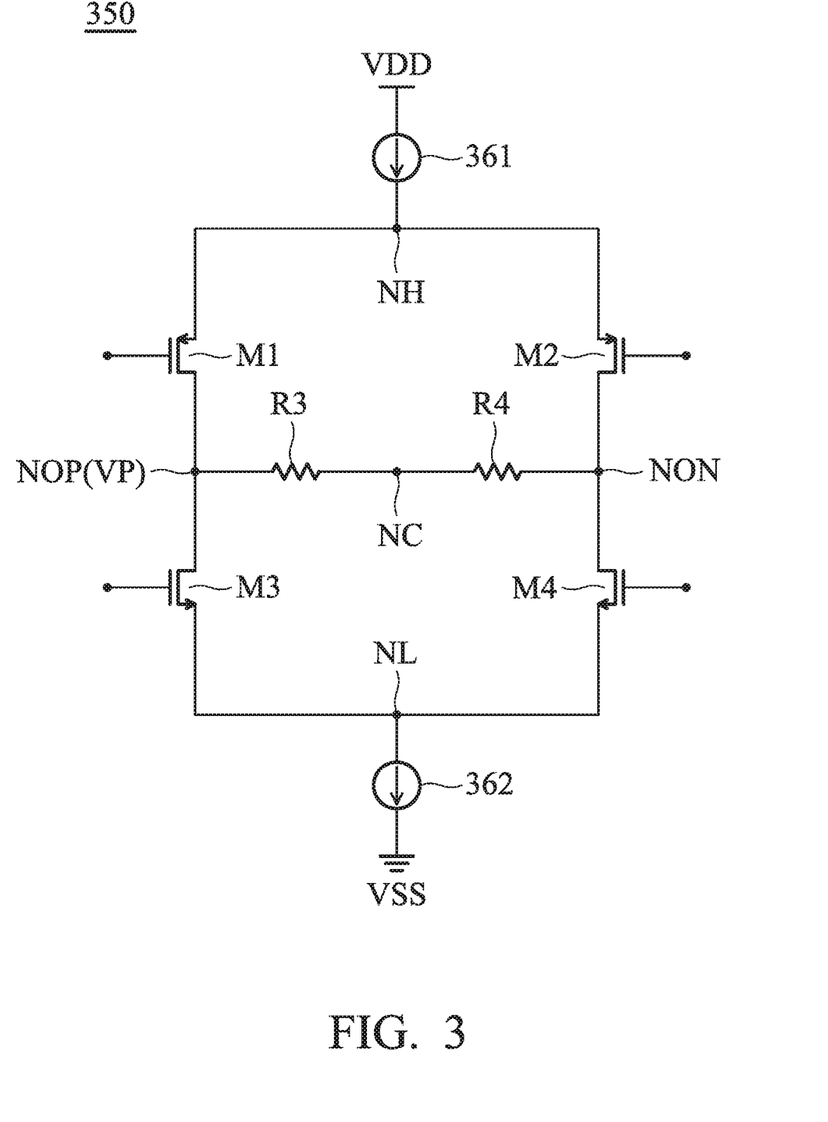
FIG. 3 is a diagram of an LVDS driving circuit according to an embodiment of the invention.

FIG. 3 is a diagram of an LVDS driving circuit 350 according to an embodiment of the invention. In the embodiment of FIG. 3, the LVDS driving circuit 350 includes a current source 361, a current sink 362, a first transistor M1, a second transistor M2, a third transistor M3, a fourth transistor M4, a third resistor R3, and a fourth resistor R4. The current source 361 is coupled between a supply voltage VDD and a high-voltage node NH, and is configured to supply a first current to the high-voltage node NH. The current sink 362 is coupled between a low-voltage node NL and a ground voltage VSS, and is configured to draw a second current from the low-voltage node NL. The first transistor M1 and the second transistor M2 may be PMOS transistors (P-type Metal Oxide Semiconductor Field Effect Transistors). The third transistor M3 and the fourth transistor M4 may be NMOS transistors (N-type Metal Oxide Semiconductor Field Effect Transistors). In other embodiments, the first transistor M1, the second transistor M2, the third transistor M3, and the fourth transistor M4 may all be PMOS transistors or may all be NMOS transistors. The first transistor M1 has a control terminal, a first terminal coupled to the high-voltage node NH, and a second terminal coupled to a positive output node NOP. The second transistor M2 has a control terminal, a first terminal coupled to the high-voltage node NH, and a second terminal coupled to a negative output node NON. The third transistor M3 has a control terminal, a first terminal coupled to the low-voltage node NL, and a second terminal coupled to the positive output node NOP. The fourth transistor M4 has a control terminal, a first terminal coupled to the low-voltage node NL, and a second terminal coupled to the negative output node NON. The third resistor R3 is coupled between the positive output node NOP and a common node NC. The fourth resistor R4 is coupled between the negative output node NON and the common node NC. The positive output node NOP and the negative output node NON collectively output a differential output signal according to the one or more data signals. In another embodiment, the current source 361 may be omitted so that the high-voltage node NH is directly connected to the supply voltage VDD; in another embodiment, the current sink 362 may be omitted so that the low-voltage node NL is directly connected to the ground voltage VSS.

The LVDS driving circuit 350 may have large parasitic capacitances at the control terminals of the first transistor M1, the second transistor M2, the third transistor M3, and the fourth transistor M4. The parasitic capacitances may slow down the logic level transitions at the transistor control terminals and the positive output node NOP and the negative output node NON, further resulting in serious output jitter. To solve this problem, the output node NOUT of the pre-driver 200 is coupled to at least one of the control terminals of the first transistor M1, the second transistor M2, the third transistor M3, and the fourth transistor M4 of the LVDS driving circuit 350. In some embodiments, the LVDS driving circuit 350 is driven by a first pre-driver and a second pre-driver. Each of the first pre-driver and the second pre-driver may have a circuit structure which is the same as the pre-driver 200 described in the embodiment of FIG. 2. Specifically, the first pre-driver may have an input node for receiving an input voltage (such as the data signal), and an output node coupled to both the control terminals of the first transistor M1 and the third transistor M3. The second pre-driver may have an input node for receiving an inverted input voltage (such as the inverted data signal), and an output node coupled to both the control terminals of the second transistor M2 and the fourth transistor M4. The pre-driver 200 has sufficient operation bandwidth, and it can improve the high-frequency performance of the LVDS driving circuit 350. In other embodiments where the first transistor M1, the second transistor M2, the third transistor M3, and the fourth transistor M4 are all PMOS transistors or all NMOS transistors, those skilled in the art may couple the output nodes of the first pre-driver and the second pre-driver to the control terminals of different transistors according to their polarity. For instance, when all of the first transistor M1, the second transistor M2, the third transistor M3, and the fourth transistor M4 are NMOS transistors, the output node of the first pre-driver may be coupled to both the control terminals of the first transistor M1 and the fourth transistor M4, and the output node of the second pre-driver may be coupled to both the control terminals of the second transistor M2 and the third transistor M3.

Figure 4A:
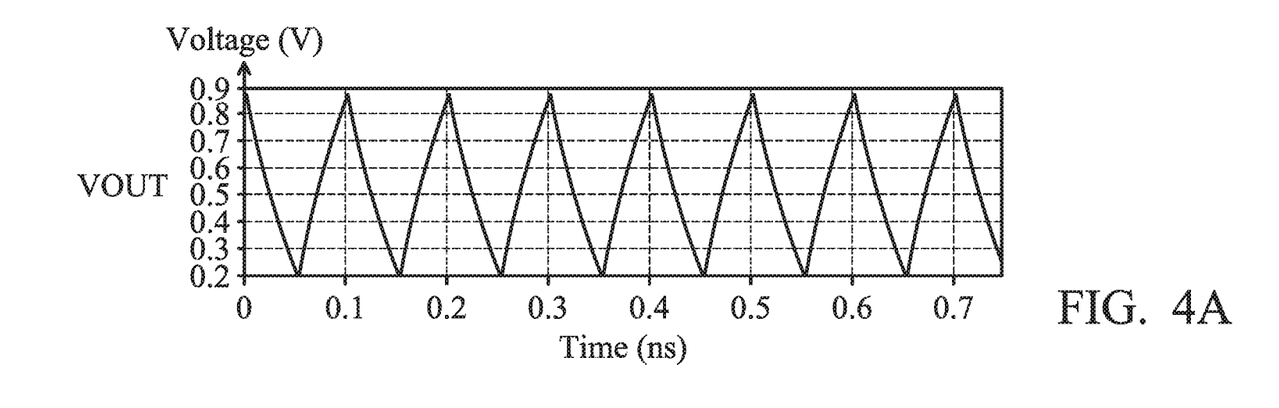
FIG. 4A is a diagram of a waveform of an output voltage at an output node of a pre-driver when a high-pass filter is removed.

FIG. 4A is a diagram of a waveform of an output voltage VOUT at the output node NOUT of the pre-driver 200 when the high-pass filter 230 is removed (i.e., the output terminal of the first inverter 110 is directly coupled to the input terminal of the second inverter 120). The horizontal axis represents time (ns), and the vertical axis represents a voltage level (V) of the output voltage VOUT. As shown in FIG. 4A, if there is no high-pass filter 230 in the pre-driver 200, the duration of each rising/falling edge of the output voltage VOUT will be relatively long. Ideally, the output voltage VOUT should have a square waveform over the time axis; however, the real output voltage VOUT of the pre-driver 200, without using the high-pass filter 230, may almost have a triangular waveform.

Figure 4B:
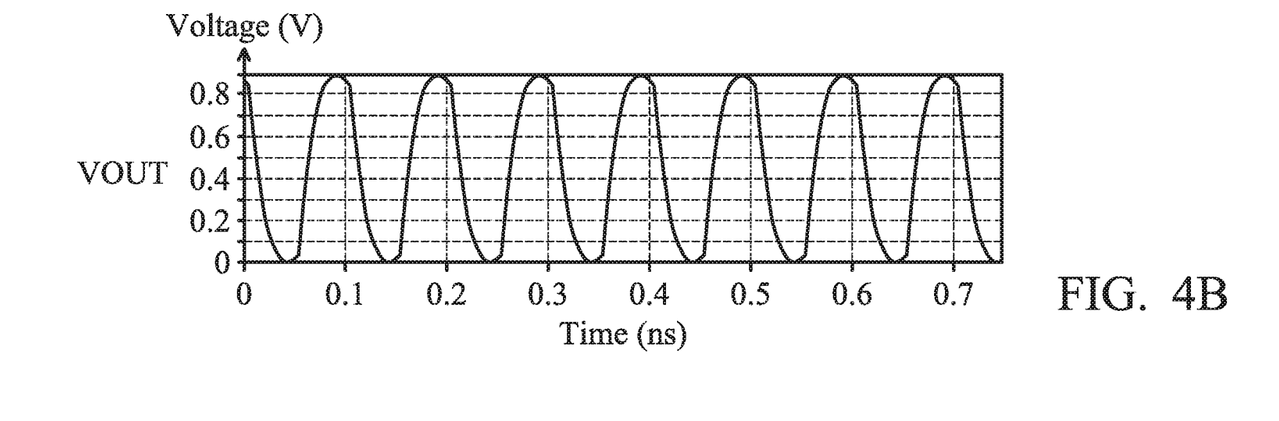
FIG. 4B is a diagram of a waveform of an output voltage at an output node of a pre-driver when a high-pass filter is included in the pre-driver, according to an embodiment of the invention.

FIG. 4B is a diagram of a waveform of the output voltage VOUT at the output node NOUT of the pre-driver 200 when the high-pass filter 230 is included in the pre-driver 200, according to an embodiment of the invention. The horizontal axis represents time (ns), and the vertical axis represents a voltage level (V) of the output voltage VOUT. As shown in FIG. 4B, if the high-pass filter 230 is used in the pre-driver 200, each rising/falling edge of the output voltage VOUT will become steeper over the time axis, and the duration of each rising/falling edge of the output voltage VOUT will become shorter. The waveform of FIG. 4B is more similar to a square waveform than that of FIG. 4A.

Figure 5A:
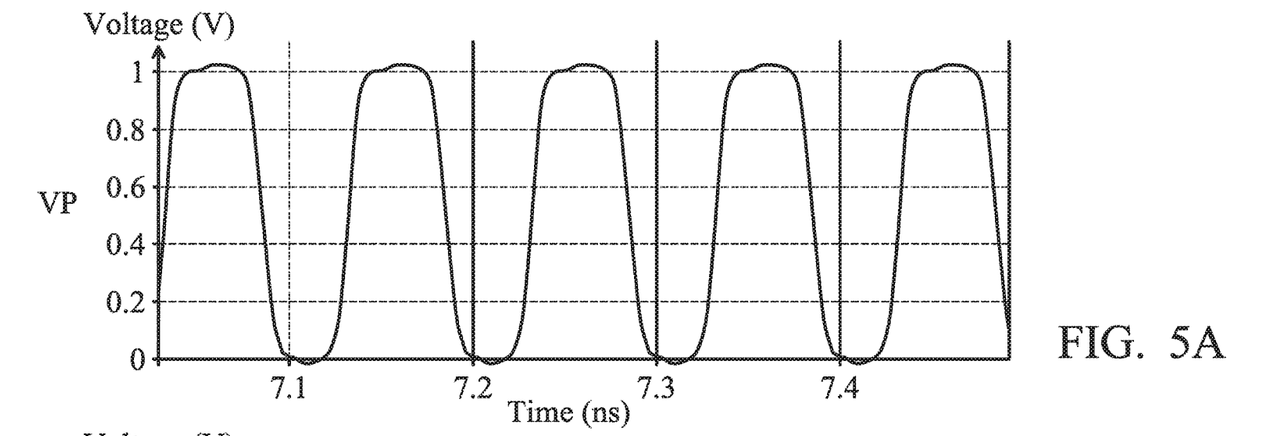
FIG. 5A is a diagram of a waveform of a positive output voltage at a positive output node of an LVDS driving circuit when a high-pass filter is removed.

FIG. 5A is a diagram of a waveform of a positive output voltage VP at the positive output node NOP of the LVDS driving circuit 350 when the high-pass filter 230 is removed (i.e., the output terminal of the first inverter 110 is directly coupled to the input terminal of the second inverter 120). The horizontal axis represents time (ns), and the vertical axis represents a voltage level (V) of the positive output voltage VP. As shown in FIG. 5A, if there is no high-pass filter 230 in the pre-driver 200, the duration of each rising/falling edge of the positive output voltage VP will be relatively long. Ideally, the positive output voltage VP should have a square waveform over the time axis; however, the real positive output voltage VP of the LVDS driving circuit 350, without using the high-pass filter 230, may almost have a triangular waveform.

Figure 5B:
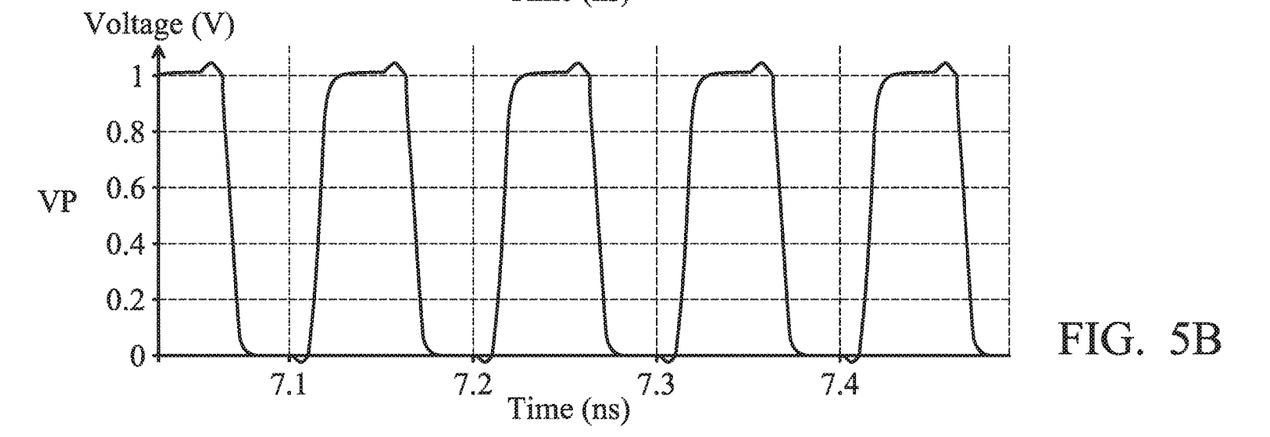
FIG. 5B is a diagram of a waveform of a positive output voltage at a positive output node of an LVDS driving circuit when a high-pass filter is included in a pre-driver, according to an embodiment of the invention.

FIG. 5B is a diagram of a waveform of the positive output voltage VP at the positive output node NOP of the LVDS driving circuit 350 when the high-pass filter 230 is included in the pre-driver 200, according to an embodiment of the invention. The horizontal axis represents time (ns), and the vertical axis represents a voltage level (V) of the output voltage VOUT. As shown in FIG. 5B, if the high-pass filter 230 is used in the pre-driver 200, each rising/falling edge of the positive output voltage VP will become steeper over the time axis, and the duration of each rising/falling edge of the positive output voltage VP will become shorter. The waveform of FIG. 5B is more similar to a square waveform than that of FIG. 5A.

Figure 6A:
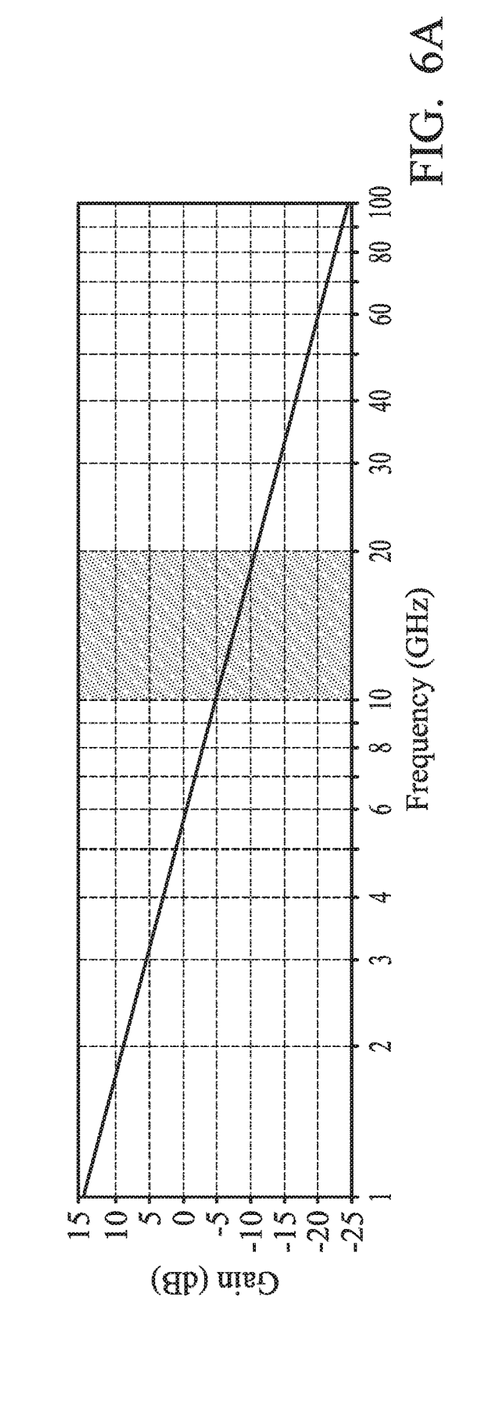
FIG. 6A is a diagram of output gain of a pre-driver when a high-pass filter is removed.

FIG. 6A is a diagram of output gain of the pre-driver 200 when the high-pass filter 230 is removed (i.e., the output terminal of the first inverter 110 is directly coupled to the input terminal of the second inverter 120). The horizontal axis represents the operation frequency (GHz), and the vertical axis represents the output gain (dB). Specifically, the output gain of the pre-driver 200 may be calculated according to the following equation (1).

$$G = 20 \times \log\left(\frac{VOUT}{VIN}\right) \qquad (1)$$

where "G" represents the output gain of the pre-driver 200, "VOUT" represents the voltage level of the output voltage VOUT at the output node NOUT of the pre-driver 200, and "VIN" represents the voltage level of the input voltage VIN at the input node NIN of the pre-driver 200.

As shown in FIG. 6A, if there is no high-pass filter 230 in the pre-driver 200, the output gain of the pre-driver 200 will decay very fast as the operation frequency of the pre-driver 200 increases. That is, the pre-driver 200 without using the high-pass filter 230 has poor performance in high-frequency bands.

Figure 6B:
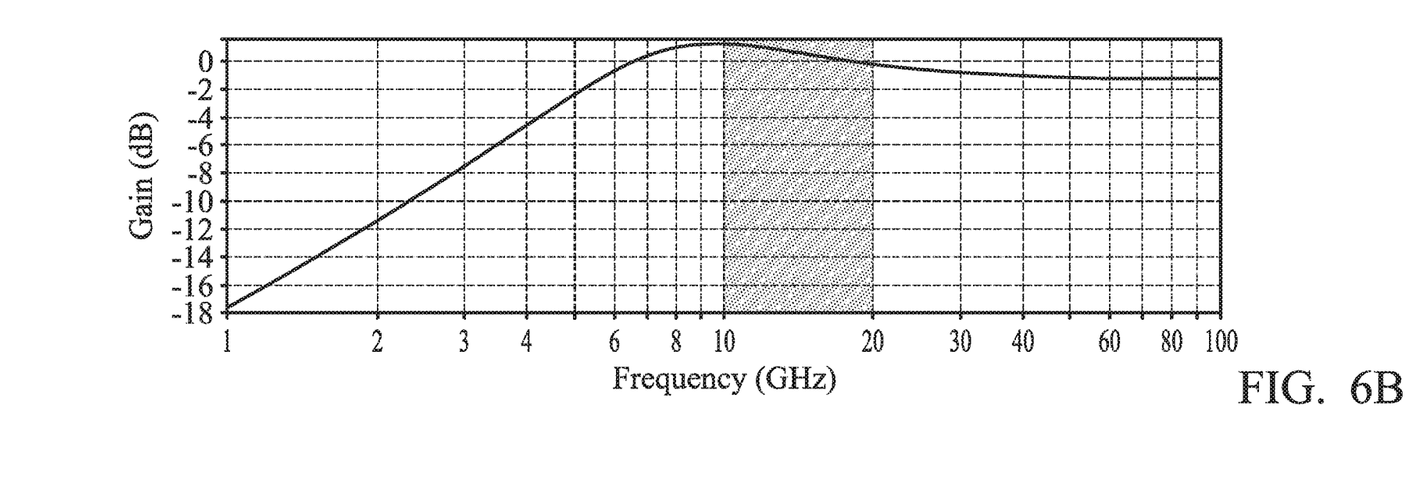
FIG. 6B is a diagram of output gain of a pre-driver when a high-pass filter is included in the pre-driver, according to an embodiment of the invention.

FIG. 6B is a diagram of output gain of the pre-driver 200 when the high-pass filter 230 is included in the pre-driver 200, according to an embodiment of the invention. The horizontal axis represents the operation frequency (GHz), and the vertical axis represents the output gain (dB). The output gain can be calculated according to the equation (1). As shown in FIG. 6B, if the high-pass filter 230 is used in the pre-driver 200, the output gain of the pre-driver 200 will be relatively flat (constant) in high-frequency bands, particularly from 10 GHz to 20 GHz. Since the high-pass filter 230 enhances the high-frequency response of the pre-driver 200, the pre-driver 200 has sufficient bandwidth and provides almost constant output gain over high-frequency bands. Accordingly, the corresponding LVDS driving circuits 350, driven by the pre-driver 200, will generate steeper output transition edges at its differential output nodes. Such a design will not tend to be affected by power supply noise, and the performance of the whole system will be significantly improved.

Figure 7:
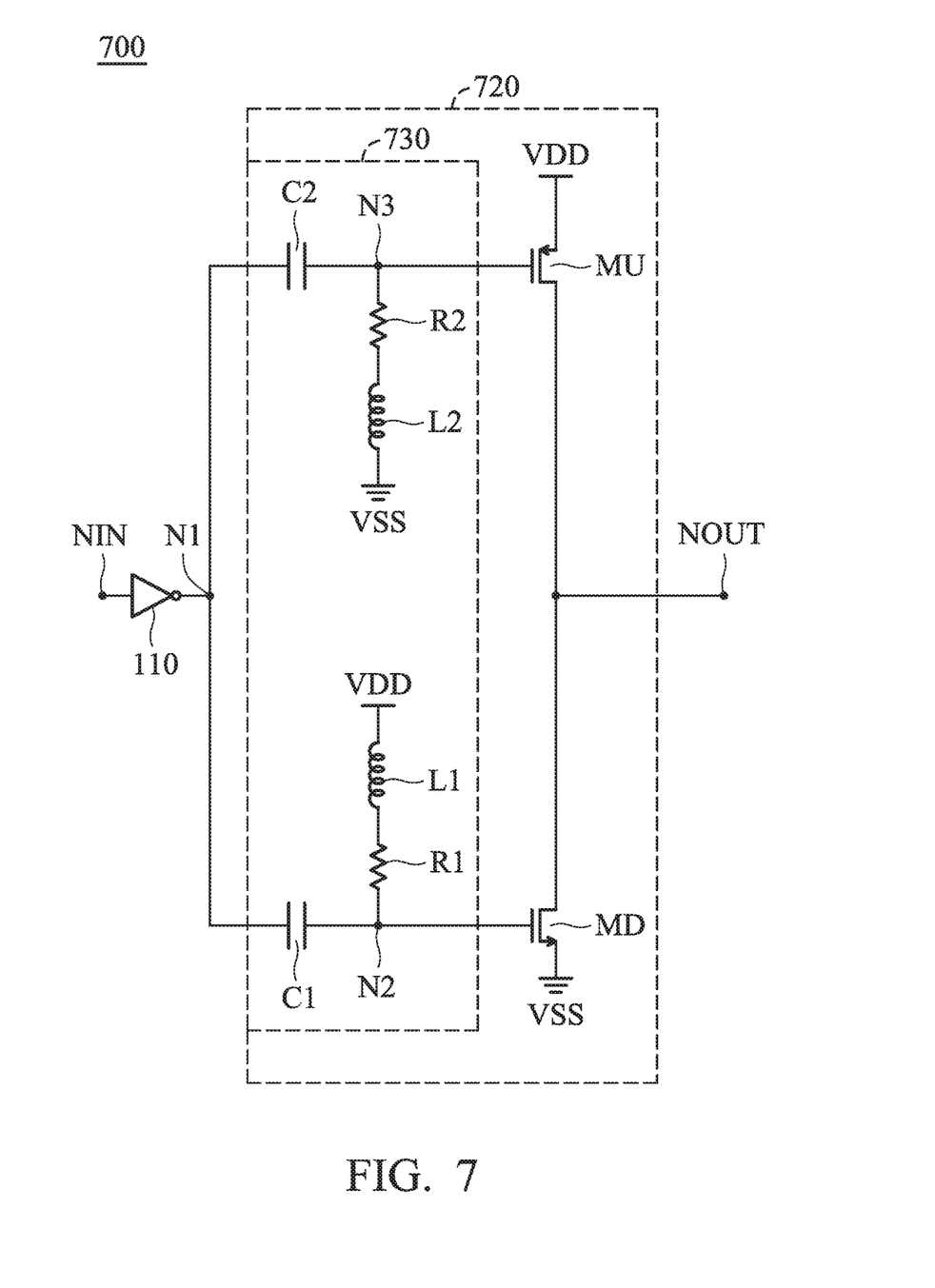
FIG. 7 is a diagram of a pre-driver according to another embodiment of the invention.

FIG. 7 is a diagram of a pre-driver 700 according to another embodiment of the invention. In the embodiment of FIG. 7, the pre-driver 700 includes a first inverter 110 and a second inverter 720, and the second inverter 720 includes a high-pass filter 730. The first inverter 110 has an input terminal coupled to an input node NIN of the pre-driver 700, and an output terminal coupled to a first node N1. The second inverter 720 has an input terminal coupled to the first node N1, and an output terminal coupled to an output node NOUT of the pre-driver 700. The high-pass filter 730 is configured to improve a high-frequency response of the pre-driver 700.

In the embodiment of FIG. 7, the second inverter 720 includes a pulling-down transistor MD and a pulling-up transistor MU. The pulling-down transistor MD may be an NMOS transistor (N-type Metal Oxide Semiconductor Field Effect Transistor), and the pulling-up transistor MU may be a PMOS transistor (P-type Metal Oxide Semiconductor Field Effect Transistor). The pulling-down transistor MD has a control terminal coupled to a second node N2, a first terminal coupled to a ground voltage VSS, and a second terminal coupled to the output node NOUT of the pre-driver 700. The pulling-up transistor MU has a control terminal coupled to a third node N3, a first terminal coupled to a supply voltage VDD, and a second terminal coupled to the output node NOUT of the pre-driver 700. The size of the second inverter 720 is greater than the size of the first inverter 110; that is to say, the aspect ratios (W/L) of the pulling-down transistor MD and the pulling-up transistor MU of the second inverter 720 are greater than the aspect ratios (W/L) of the CMOS transistors of the first inverter 110.

In the embodiment of FIG. 7, the high-pass filter 730 includes a first capacitor C1, a second capacitor C2, a first inductor L1, a second inductor L2, a first resistor R1, and a second resistor R2. The first capacitor C1 is coupled between the first node N1 and the second node N2. The second capacitor C2 is coupled between the first node N1 and the third node N3. The first inductor L1 and the first resistor R1 are coupled in series between the supply voltage VDD and the second node N2. The second inductor L2 and the second resistor R2 are coupled in series between the third node N3 and the ground voltage VSS. The locations of the first inductor L1 and the first resistor R1 (and also the locations of second inductor L2 and the second resistor R2) may be exchanged without affecting the overall performance, as may be understood by those skilled in the art. The arrangement of the embodiment of FIG. 7 combines the functions of the second inverter 120 and the high-pass filter 230 of the pre-driver 200 into the second inverter 720 of the pre-driver 700; in addition, the arrangement of the embodiment of FIG. 7 can further eliminate the current path from the supply voltage VDD to the ground voltage VSS (i.e., the current path through the first inductor L1, the first resistor R1, the second resistor R2, and the second inductor L2 in FIG. 2), thereby reducing the total power consumption of the pre-driver 700.

The pre-driver 700 may be used to drive the LVDS driving circuit 350, as described in the embodiment of FIG. 3. The output node NOUT of the pre-driver 700 is coupled to at least one of the control terminals of the first transistor M1, the second transistor M2, the third transistor M3, and the fourth transistor M4 of the LVDS driving circuit 350. In some embodiments, the LVDS driving circuit 350 is driven by a first pre-driver and a second pre-driver. Each of the first pre-driver and the second pre-driver may have a circuit structure which is the same as the pre-driver 700 described in the embodiment of FIG. 7. The first pre-driver may have an input node for receiving an input voltage, and an output node coupled to both the control terminals of the first transistor M1 and the third transistor M3. The second pre-driver may have an input node for receiving an inverted input voltage, and an output node coupled to both the control terminals of the second transistor M2 and the fourth transistor M4. As described in above, in other embodiments, those skilled in the art may also couple the output nodes of the first pre-driver and the second pre-driver to the control terminals of different transistors according to their polarity. The pre-driver 700 has sufficient operation bandwidth, and it can improve the high-frequency performance of the LVDS driving circuit 350. Other features of the pre-driver 700 of FIG. 7 are similar to those of the pre-driver 200 of FIG. 2. Accordingly, the two embodiments can achieve similar levels of performance.

In some embodiments, the parameters of the pre-driver 700 are set as follows. The capacitance of the first capacitor C1 is about 0.3 pF. The capacitance of the second capacitor C2 is about 0.3 pF. The inductance of the first inductor L1 is about 0.5 nH. The inductance of the second inductor L2 is about 0.5 nH. The resistance of the first resistor R1 is about 100Ω. The resistance of the second resistor R2 is about 100Ω. The resonant frequency of the high-pass filter 730 is about 13 GHz, corresponding to the high-frequency operation bands of the LVDS driving circuit above 10 GHz.

The invention provides a novel pre-driver for driving an LVDS driving circuit. In the conclusion, the proposed design has at least the following advantages, compared with the prior art: (1) compensating for the high-frequency response of the pre-driver; (2) widening the operation bandwidth of the pre-driver; (3) providing almost constant high-frequency output gain of the pre-driver; and (4) eliminating the output jitter of the LVDS driving circuit.

Note that the above voltages, currents, resistances, inductances, capacitances and other element parameters are not limitations of the invention. A designer can adjust these parameters according to different requirements. The pre-driver and LVDS driving circuit of the invention are not limited to the configurations of FIGS. 1-7. The invention may merely include any one or more features of any one or more embodiments of FIGS. 1-7. In other words, not all of the features displayed in the figures should be implemented in the pre-driver and LVDS driving circuit of the invention. In addition, the first transistor, the second transistor, the third transistor, and the fourth transistor of the LVDS driving circuit, and the pulling-down transistor and the pulling-up transistor of the pre-driver may be implemented by other configurations such as all N-type transistors or all P-type transistors with the polarities of the signals and devices correspondingly changed without departing from the principles of the invention.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

It will be apparent to those skilled in the art that various modifications and variations can be made in the invention. It is intended that the standard and examples be considered exemplary only, with a true scope of the disclosed embodiments being indicated by the following claims and their equivalents.

What is claimed is:

1. A pre-driver for driving an LVDS (Low Voltage Differential Signaling) driving circuit according to a data signal and an inverted data signal, the pre-driver comprising a first pre-driver circuit and a second pre-driver circuit, wherein each of the first pre-driver circuit and the second pre-driver circuit comprises:

an inverter, having an input terminal connected to an input node of the first pre-driver circuit or the second pre-driver circuit, and an output terminal connected to a first node, wherein the inverter is a CMOS (Complementary Metal Oxide Semiconductor) inverter comprising CMOS transistors, wherein the input node of the first pre-driver circuit is coupled to the data signal and the input node of the second pre-driver circuit is coupled to the inverted data signal;

a first capacitor, connected between the first node and a second node;

a first resistor, having a first terminal connected to the second node, and a second terminal;

a first inductor, having a first terminal connected to the second terminal of the first resistor, and a second terminal connected to a supply voltage;

a second capacitor, connected between the first node and a third node;

a second resistor, having a first terminal connected to the third node, and a second terminal;

a second inductor, having a first terminal connected to the second terminal of the second resistor, and a second terminal connected to a ground voltage;

a pulling-down transistor, having a control terminal connected to the second node, a first terminal coupled to the ground voltage, and a second terminal coupled to an output node of the first pre-driver circuit or the second pre-driver circuit; and a pulling-up transistor, having a control terminal connected to the third node, a first terminal coupled to the supply voltage, and a second terminal coupled to the output node of the first pre-driver circuit or the second pre-driver circuit;

wherein aspect ratios of the pulling-down transistor and the pulling-up transistor are greater than aspect ratios of the CMOS transistors of the inverter, wherein capacitances of the first capacitor and the second capacitor are about 0.3pF, inductances of the first inductor and the second inductor are about 0.5nH, and resistances of the first resistor and the second resistor are about 100Ω, wherein the LVDS driving circuit comprises:

a first transistor, wherein the first transistor has a control terminal coupled to the output node of the first pre-driver circuit, a first terminal coupled to the supply voltage, and a second terminal coupled to a positive output node;

a second transistor, wherein the second transistor has a control terminal coupled to the output node of the second pre-driver circuit, a first terminal coupled to the supply voltage, and a second terminal coupled to a negative output node;

a third transistor, wherein the third transistor has a control terminal coupled to the output node of the first pre-driver circuit, a first terminal coupled to a ground voltage, and a second terminal coupled to the positive output node; and a fourth transistor, wherein the fourth transistor has a control terminal coupled to the output node of the second pre-driver circuit, a first terminal coupled to the ground voltage, and a second terminal coupled to the negative output node.

* * * * *